(12) United States Patent
Helster et al.

(10) Patent No.: US 6,663,442 B1
(45) Date of Patent: Dec. 16, 2003

(54) HIGH SPEED INTERCONNECT USING PRINTED CIRCUIT BOARD WITH PLATED BORES

(75) Inventors: David W. Helster, Harrisburg, PA (US); Scott K. Mickievicz, Elizabethtown, PA (US); Howard W. Andrews, Hummelstown, PA (US); George R. Defibaugh, Harrisburg, PA (US); Lynn R. Sipe, Mifflintown, PA (US); John J. Consoli, Harrisburg, PA (US); James L. Fedder, Etters, PA (US); Chad W. Morgan, Mechanicsburg, PA (US); Alexander M. Sharf, Harrisburg, PA (US); Matthew R. McAlonis, Wrightsville, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 09/491,658

(22) Filed: Jan. 27, 2000

(51) Int. Cl.[7] .................................................. H05K 1/11
(52) U.S. Cl. ........................................ 439/751; 174/266
(58) Field of Search ............................ 439/78, 83, 751; 174/266, 267

(56) References Cited

U.S. PATENT DOCUMENTS

| 2,958,064 | A |   | 10/1960 | Swengel |
|---|---|---|---|---|
| 3,436,819 | A |   | 4/1969 | Lunine ........................ 29/628 |
| 4,787,853 | A |   | 11/1988 | Igarashi ....................... 439/55 |
| 4,906,198 | A | * | 3/1990 | Cosimano |
| 5,038,252 | A |   | 8/1991 | Johnson ...................... 361/414 |
| 5,543,586 | A |   | 8/1996 | Crane, Jr. et al. ........... 174/262 |
| 5,619,791 | A |   | 4/1997 | Lambrecht, Jr. et al. ...... 29/852 |
| 5,823,830 | A | * | 10/1998 | Wurster ....................... 439/751 |
| 5,841,075 | A |   | 11/1998 | Hanson ....................... 174/250 |
| 5,905,640 | A |   | 5/1999 | Hutchison et al. .......... 361/783 |
| 5,925,210 | A |   | 7/1999 | Wagenbrenner et al. . 156/306.9 |
| 5,961,349 | A |   | 10/1999 | Paagman ..................... 439/607 |
| 6,181,219 | B1 | * | 1/2001 | Gailus .......................... 333/33 |

FOREIGN PATENT DOCUMENTS

| DE | DT 23 38 647 A1 | 2/1975 |   |
|---|---|---|---|
| EP | 0 384 927 A1 | 9/1990 |   |
| EP | 0 418 508 A1 | 3/1991 |   |
| JP | 59 088852 A | 11/1982 |   |
| JP | 03-145791 A | 6/1991 | ............ H05K/1/18 |
| JP | 07-045914 A | 2/1995 |   |

* cited by examiner

*Primary Examiner*—Neil Abrams

(57) ABSTRACT

A printed circuit board includes a bore having a perimeter and a total depth. An electrically conductive barrel extends around at least a portion of the perimeter of the bore and along a predetermined depth of the bore, the predetermined depth being less than the total depth of the bore. The barrel has an end that terminates at a countersunk portion of the bore. A contact includes a body having first and second ends. The first end includes a compliant section that is positioned in the barrel, thereby forming a separable interface between the contact and the circuit board. The second end extends out of the barrel and interfaces with an electrical component. Protrusion of the first end out of the barrel is minimized. The above relationships are used to decrease capacitive loading.

4 Claims, 7 Drawing Sheets

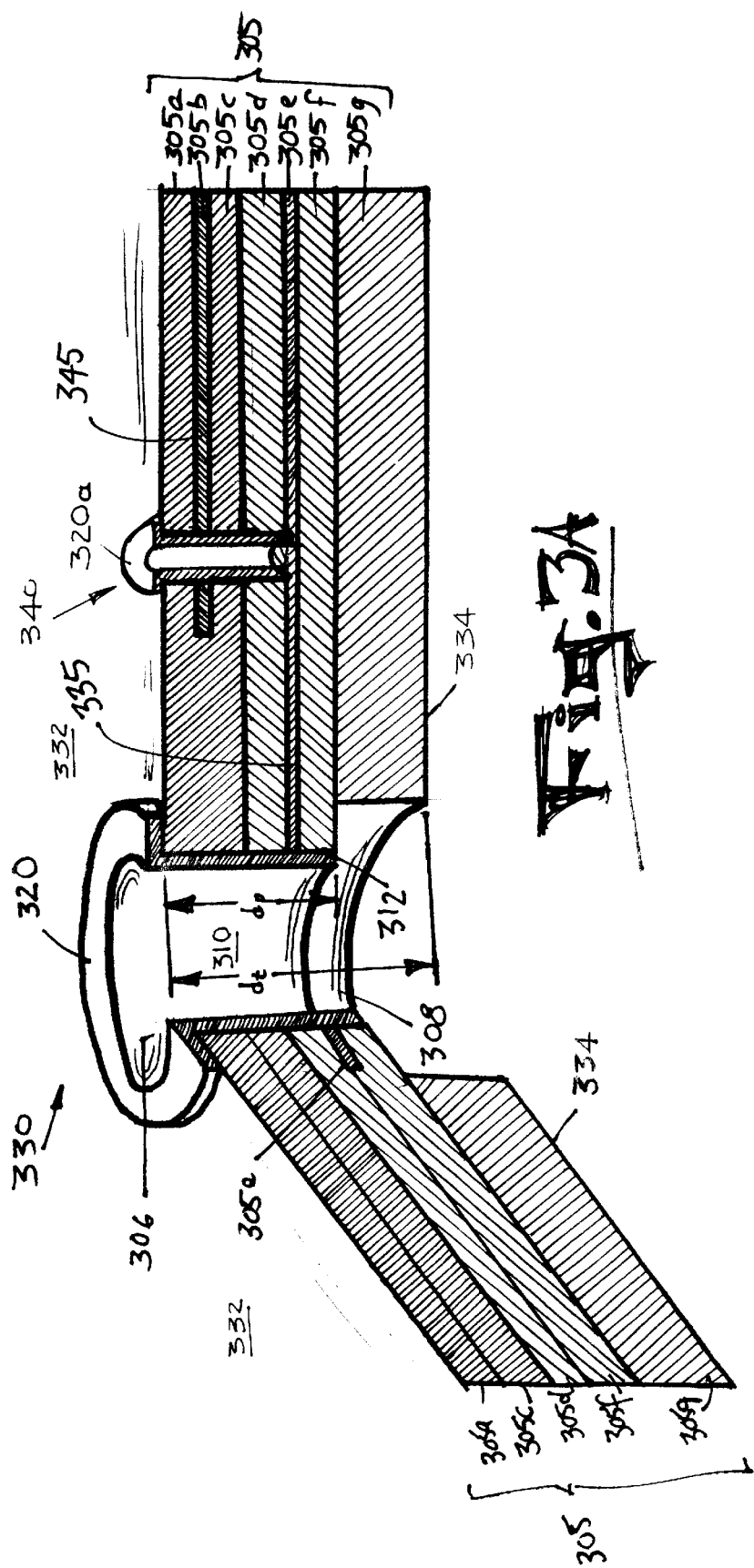

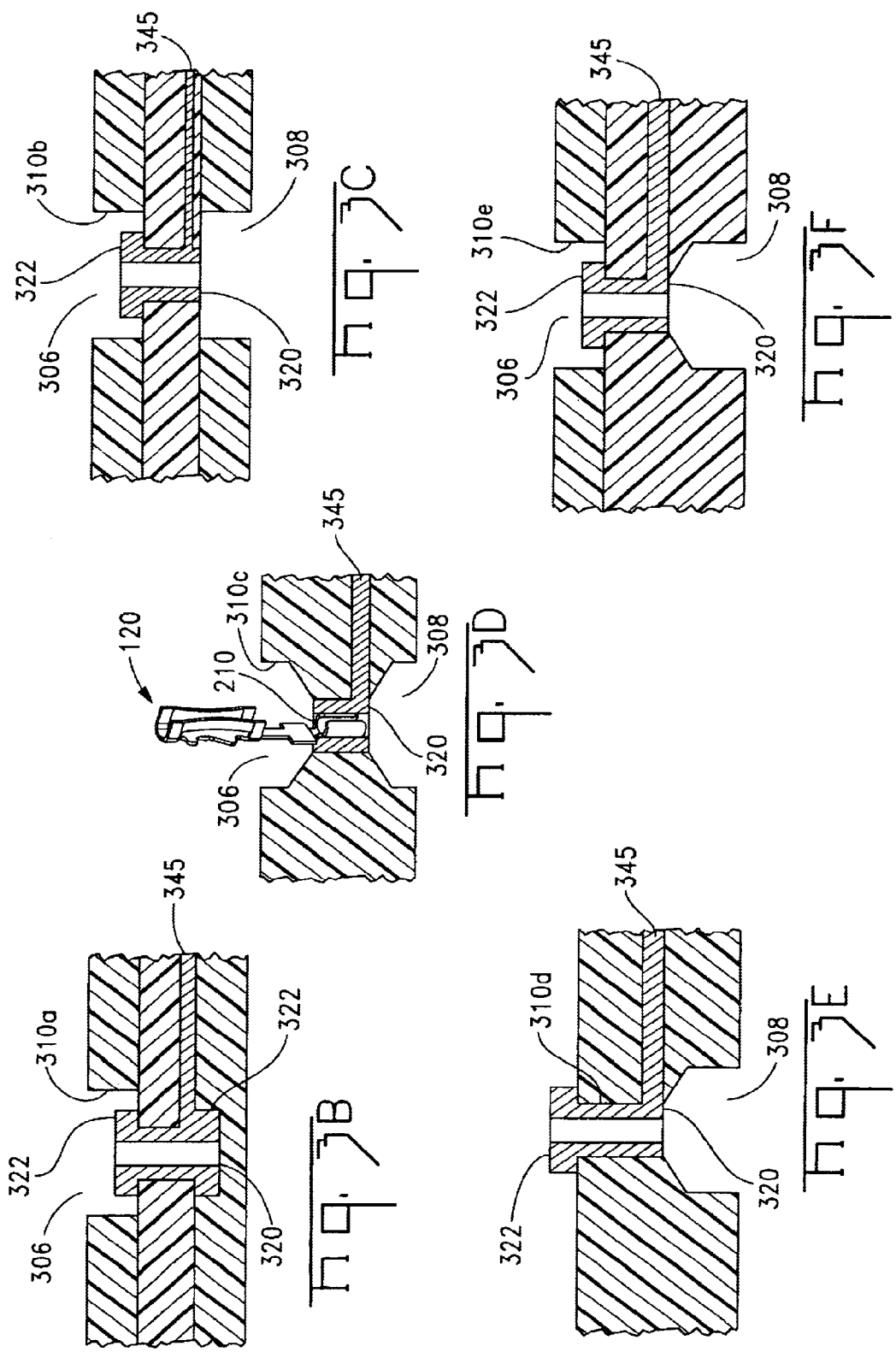

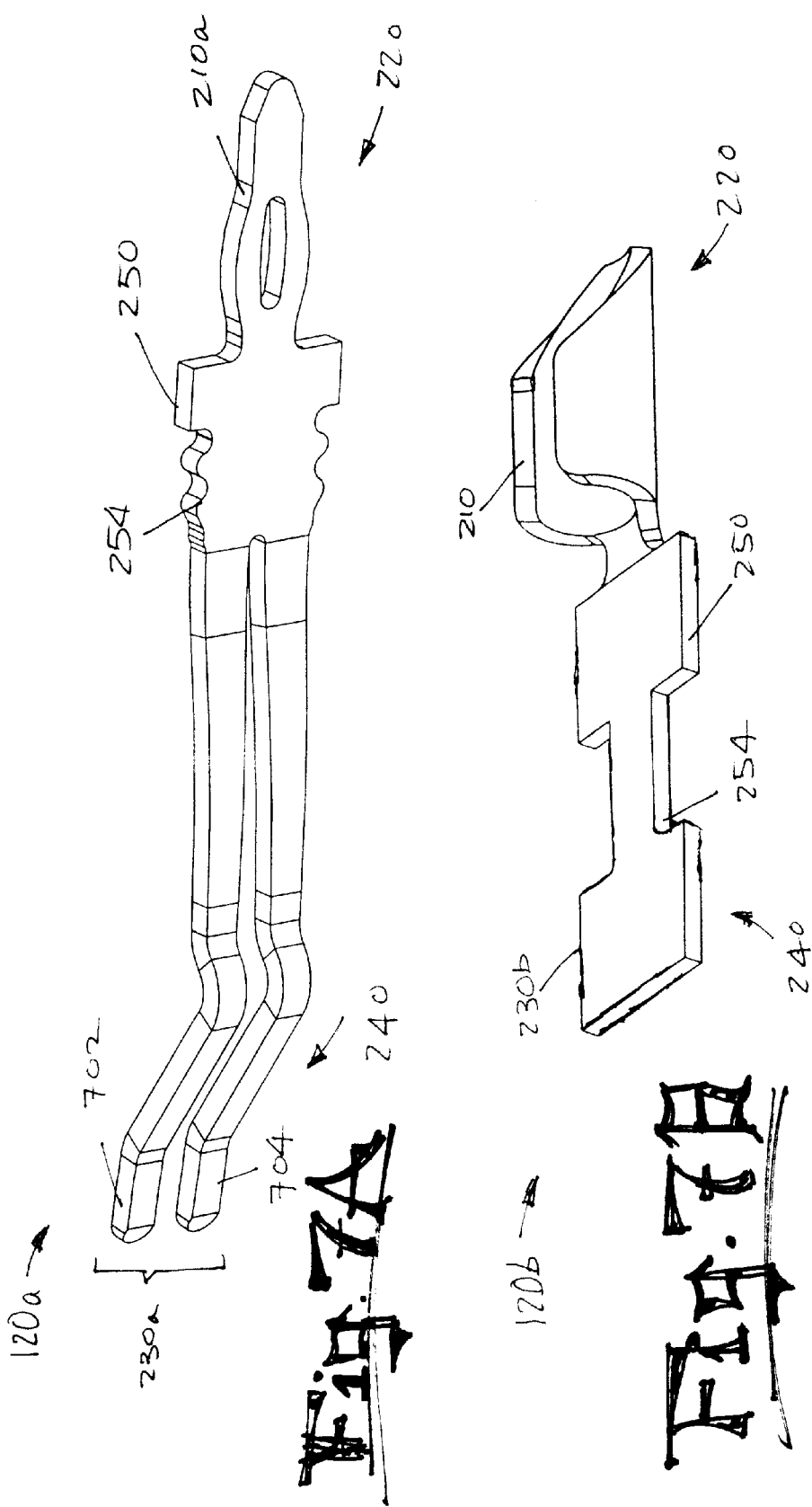

HIGH SPEED INTERCONNECT USING PRINTED CIRCUIT BOARD WITH PLATED BORES

BACKGROUND OF THE INVENTION

1. Field of the Invention

This invention relates to the construction and operation of electronic equipment and, more particularly, to the electrical interconnection of the various parts that comprise a piece of electronic equipment.

2. Description of the Related Art

Most electronic equipment is assembled from a variety of functional parts that must be electrically interconnected. One common type of part from which electronic equipment is typically assembled are referred to as "boards" or "cards." Boards consist of electronic devices, such as memory devices, controllers, or processors, mounted on or to a "printed circuit board" ("PCB"). A PCB usually includes an insulative, or non-conducting, layer on, or in, which electrically conductive traces are printed or etched. The traces electrically connect the electronic devices to one another across, and sometimes through, the board. More typically, a PCB includes several such board layers laminated together. In this more typical embodiment, conductive layers might be laminated between insulative layers to define traces in the multi-layer PCB. The electrically conductive traces on different board layers are electrically connected by "vias." Vias are bored through the board layers and either metal-plated for the length of the bore or filled with a metallic plug. The term "via" is therefor used broadly herein and encompasses, without limitation, plated-through holes, blind vias, and even bores lined with metallic inserts. Electronic devices are usually mounted on the outside of such a "multi-layer" PCB rather than being embedded between layers prior to lamination.

The internal functions that a piece of electronic equipment performs are generally segregated by fiction onto certain boards. Boards are frequently referenced according to their fiction. For instance, a "motherboard" is usually the principal board of a computer in that the electronic devices that direct the computer's operation, e.g., the central processing unit, memory, and basic controllers, are mounted to it. For this reason, the motherboard is sometimes also called the "system board" or "main board." The motherboard typically also includes connectors for attaching devices to the piece's bus, or collection of wires over which electronic information is exchanged. Other types of boards commonly referenced include:

backplanes, or circuit boards containing sockets into which other circuit boards may be plugged;

expansion boards, which are any board that plugs into one of the equipment piece's expansion slots, and include controller boards, local area network ("LAN") cards, and video adapters;

daughterboard, which are any board that attaches directly to another board.

controller boards, which are a special type of expansion board that contains a controller for a peripheral device;

network interface cards, which are expansion boards that enable a piece of electronic equipment to connect to a network; and video adapters, which are expansion boards that contain a controller for a graphics monitor.

This list is exemplary, and not exhaustive. Note that the categorizations overlap so that any particular board might be classified as more than one kind of board.

Boards are typically required to "interconnect" with one another to perform their intended functions. These interconnections impact performance. As the technology matures and electronic equipment becomes more complex, these interconnections impact electrical performance more greatly and, thus, become more important. Sometimes, one board plugs directly into another, in the manner of a daughterboard and a motherboard. Other times, connectors are mounted to the boards and cables are plugged into the connectors to interconnect the boards. Either way, each interconnection affects signal quality and information throughput. Even a single interconnection, if implemented sufficiently poorly, can degrade the electrical performance of the equipment. As performance requirements increase, so does the significance of the interconnections in terms of performance.

One relatively old type of interconnection is the "through-hole interconnection." This approach was developed by at least the early 1960's, and was quickly improved upon. One example of this approach is disclosed in U.S. Pat. No. 3,436,819, entitled "Multilayer Laminate," issued Apr. 8, 1969, to Litton Systems, Inc. as the assignee of the inventor David Lunine ("the '819 patent"). Essentially, this type of interconnect requires that the circuits on the various plates in the board have vertically aligned metal "landings," or "pads." A hole is then bored through the board, and the hole is metal-plated. The metal plating of the bore electrically connects the various circuits on the board. A second board has a pin mounted to it, and the pin is mated with the metal-plated bore to establish the interconnection between the first and second boards.

However, this technique had several characteristics that impeded performance. For example, these characteristics restricted the trace placement and density on boards, which the art then addressed. See the '819 patent, col. 1, line 52 to col. 2, line 11; U.S. Pat. No. 4,787,853, entitled "Printed Circuit Board with Through-Hole Connection," issued Nov. 29, 1988, to Kabushiki Kaisha Toshiba, as the assignee of the inventor Yutaka Igarashi. Also, the art discovered that a through-hole's internal profile may be manipulated to facilitate internal trace placement and thereby improve performance. See U.S. Pat. No. 5,038,252, entitled "Printed Circuit Boards With Improved Electrical Current Control," issued Aug. 6, 1991, to Teradyne, Inc. as the assignee of the inventor Lennart B. Johnson.

However, as electronic equipment becomes more complex and performance continues to rapidly increase, all areas of system design are receiving renewed scrutiny. Interconnections are no exception. Even small improvements in interconnection design can significantly impact system performance in high performance applications. Still, what has not been fully understood by the art is the affect of the interconnection's design on the electrical characteristics of the signal path.

One of the typical considerations in interconnect design is to develop a good, solid electrical contact between the pin and receptacle that form the interconnect. See U.S. Pat. No. 5,619, 791, entitled "Method for Fabricating Highly Conductive Vias," issued Apr. 15, 1997, to Lucent Technologies, Inc. as the assignee of the inventors Vincent G. Lambrecht, Jr., et al. A typical approach metal-plates the entire length of the via to maximize the area of conductive contact between the pin and receptacle. Furthermore, some in the art believe "longer" or "deeper" vias help reduce, or at least control, undesirable inductances between layers, at least in the presence of narrow via diameters. See U.S. Pat. No. 5,841, 975, entitled "Method for Reducing Via Inductance in an Electronic Assembly and Article," issued Nov. 24, 1998, to W. L. Gore & Associates, Inc. as the assignee of the inventor David A. Hanson. Some in the art also believe that the design of a contact in the interconnection has little impact on electrical performance. However, it has been discovered that these approaches are actually detrimental to performance, especially in high performance computing applications.

The present invention is directed to resolving, or at least reducing, one or all of the problems mentioned above.

SUMMARY OF THE INVENTION

The invention, in its various aspects and embodiments, is a high speed interconnection and parts thereof for use in electronic equipment. The interconnection, in one embodiment, comprises a component, a printed circuit board, and a contact. The component includes a conductor. The printed circuit board includes an electrically conductive trace and a via, the via comprising a bore and an electrically conductive barrel. The bore is defined by the printed circuit board. The electrically conductive barrel is formed about at least a portion of the perimeter of the bore across a predetermined depth of the bore defined by the trace. The predetermined depth is less than the total depth of the bore and the barrel contacts the trace. The contact comprises a body including first and second ends. The first end is positioned in the barrel. The second end extends from the first end out of the barrel and interfaces with the component to contact the conductor.

BRIEF DESCRIPTION OF THE DRAWINGS

The invention may be understood by reference to the following description taken in conjunction with the accompanying drawings, in which like reference numerals identify like elements, and in which:

FIG. 3A is partially sectioned, isometric view of a via, such as the via in the interconnection of FIG. 1, constructed in accordance with the present invention;

FIGS. 3B–3F are cross-sectional, plan views of alternative embodiments for vias in accordance with the present invention;

FIG. 4 depicts the interconnection of FIGS. 1–3A in the larger context from which FIG. 1 is fragmented;

FIGS. 7A–7B illustrate embodiments of the contact in accordance with the present invention to that shown in FIG. 2.

Figure 1:
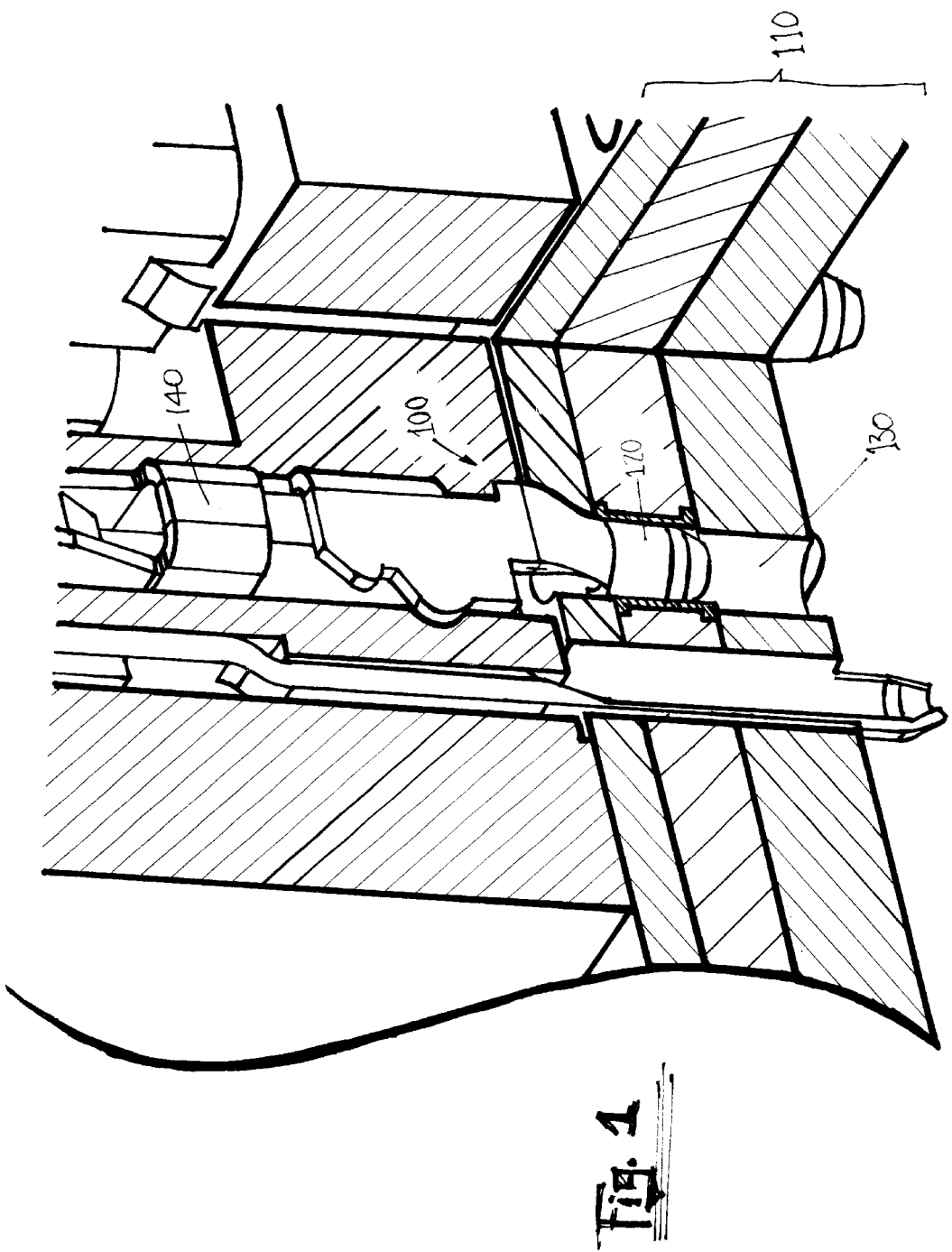
FIG. 1 is a fragmented, isometric, right angle section of an interconnection in one particular embodiment constructed in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Turning now to the drawings, FIG. 1 is a fragmented, right angle section of an interconnection 100 between a multi-layer printed circuit board 110 and another component, e.g., a second printed circuit board (not shown). The interconnection 100 is but one embodiment of the present invention constructed in accordance therewith. Note that the invention is not necessarily limited to interconnections between boards, and that the interconnection might be between, inter alia, the connector of a cable, an active device, and a printed circuit board, in alternative embodiments. The interconnection 100 is principally implemented by the insertion of a contact 120 into a via 130 and the creation of a separable interface 140 as are described further below. FIG. 1 shows only a single contact 120 via 130 separable interface 140 combination in the interconnection 100. However, as those in the art having the benefit of this disclosure will appreciate, an interconnection will typically contain a plurality of such combinations.

Figure 2:
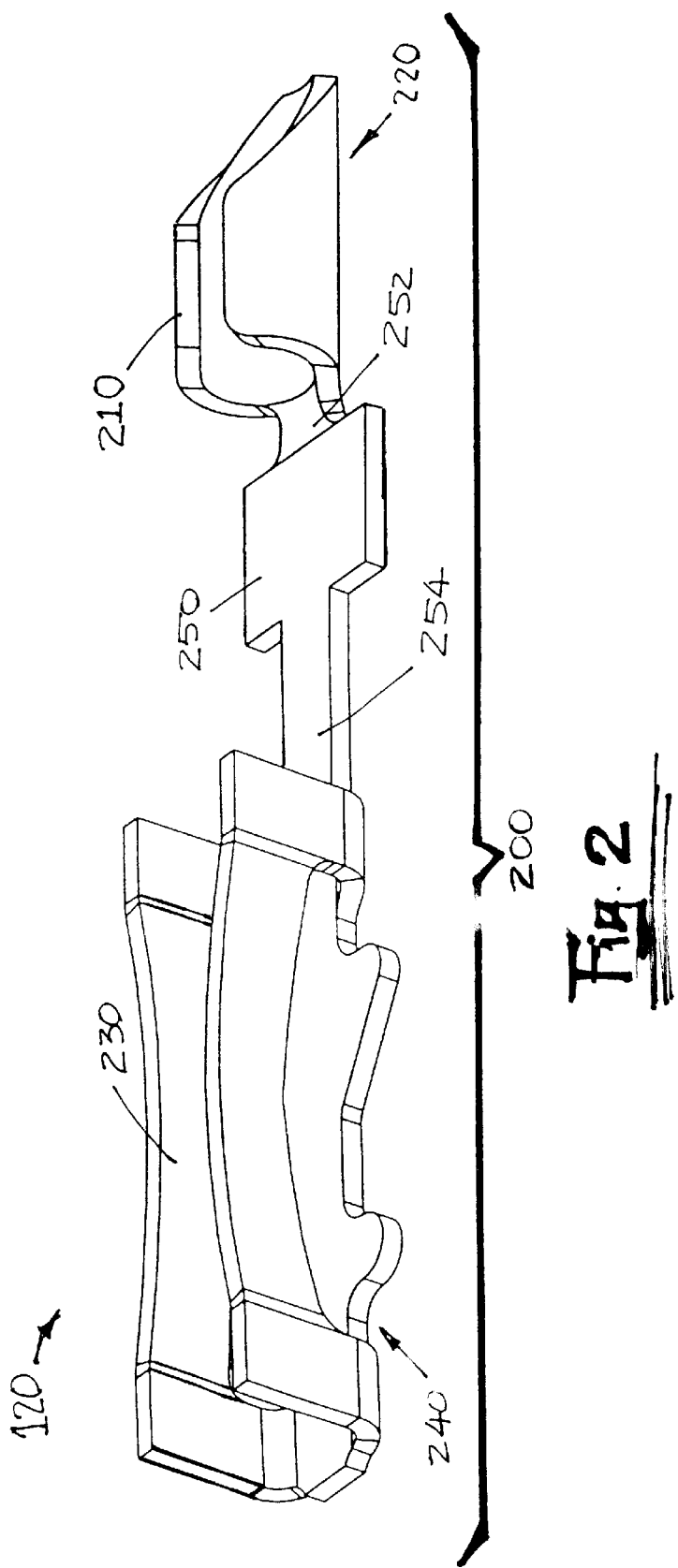
FIG. 2 is an isometric view of one particular embodiment of a contact constructed in accordance with the present invention.

FIG. 2 is an isometric view of one particular embodiment of a contact 120a constructed in accordance with the present invention. In this particular embodiment, the contact 120 comprises a body 200 constructed from an electrically conductive material. Suitable materials for this construction include, but are not limited to, copper, modified copper, iron copper, stainless steel, bronze, phosphor bronze, and beryllium copper. The contact body 200 includes a first end 220 and a second end 240, both of which admit variation in design. For instance, note. that the second end 240 of the contact 120a in FIG. 2 differs from that of the contact 120 in FIG. 1. These and other variations will be discussed in more detail below.

Returning to FIG. 2, the first end 220, in this particular embodiment, comprises a compliant, interference press fit section 210. The second end 240 comprises a box-like, or "boxed," pin receptacle 230. The press fit section 210 is, more particularly, a compliant "C" structure, but may alternatively be an eye-of-needle structure or a split pin in other embodiments. One commericially available split pin structure suitable for implementing some aspects of the present invention is found in the contact marketed under the mark ACTION PIN™ by AMP, Inc., the assignee of this application. In some alternative embodiments, the first end 220 might even be a solder tail, which is neither compliant nor a press fit structure. A structure 250 extends from the press fit section 210 by a first neck 252 and the pin receptacle 230 extends from the structure 250 by a second neck 254. The structure 250 is roughly square shaped in this particular embodiment, but the shape of the structure 250 is not necessary to the practice of the invention. Some alternative embodiments of the contact 120 may even omit the structure 250.

The pin receptacle 230 comprises the second end 240 of the contact 120 and is used to establish an electrical contact.

This electrical contact is a separable interface, allowing one to make or break the interconnection as desired. This electrical contact provides a signal path, in conjunction with structure 250 and the press fit section 210, between two conductors, e.g., electrically conductive traces in two different printed circuit boards. Note that any suitable structure known to the art may be used to establish the electrical contact at the second end 240. Alternative embodiments might therefore employ some other mechanism for establishing a separable interface. A means for establishing a surface mount contact, such as a soldering tab, might be used. Thus, the pin receptacle 230 of the contact 120 is, by way of example and illustration, but one means for establishing the second electrical contact in accordance with the present invention.

FIG. 3A is partially sectioned, isometric view of a via 330, such as the via 130 in the interconnection 100 of FIG. 1, constructed in accordance with the present invention. The via 330 includes a bore 310 defined by a printed circuit board 305. The board 305 is a multilayer board, comprising several layers 305a–305f, each of which defines a section of the bore 310. The layers 305a, 305c, 305d, 305f, and 305g are insulators, while the layers 305b and 305e are conductors. Indeed, the layer 305b comprises the trace 345 and the layer 305e comprises the trace 335, discussed further below. An electrically conductive barrel 320 is formed about at least a portion of the perimeter of the bore 310. In the illustrated embodiment, the barrel 320 is formed about the entire perimeter of the bore 310. The barrel 320, however, does not cover the full depth of the bore 310. Rather, the barrel 320 is formed across a predetermined depth $d_p$ of the bore that is less than the total depth $d_t$ of the bore.

Typically, the predetermined depth $d_p$ extends from the top 306 or bottom 308 of the bore 310 to just past the trace 335 with which contact is desired, as is shown in FIG. 3A. However, even in embodiments where the barrel 320 does not begin at the top 306 (or bottom 308) of the bore 310, the barrel 320 will stop just past the trace 335. In this sense, the trace determines the predetermined depth $d_p$. As those in the art will appreciate, the labels "top" and "bottom" are relative and may be interchanged for the convenience of the designer, assembler, or installer. The board 305 may be fabricated in accordance with conventional practice. Any suitable technique known to the art may be used.

The barrel 320 in FIG. 3A is fabricated by through-plating the bore 310 all the way from the top 306 to the bottom 308 of the bore 310. The barrel 320 may be fabricated from the same material as the contact 120, although this is unlikely. Typically, the barrel 320 will be fabricated from copper whereas the contact 120 will be fabricated from an alternative material, such as phosphor-bronze. Then, contrary to conventional practice, the bore 310 is counter-sunk from the bottom 308 upward to just below the trace 335 to remove the plated material beyond the trace 335. This removal creates the bottom edge 312 of the barrel 320. In this embodiment, the bottom edge 312 of the barrel 320 coincides with the bottom of the layer 305f. However, boundaries between layers are, in this particular embodiment, immaterial—the location of the trace 335 determines the predetermined depth $d_p$.

The design and fabrication of the bore 310 and barrel 320 admit variation from the embodiment illustrated in FIG. 3A. FIGS. 3B–3F illustrate alternative embodiments 330a–330e in which the respective bore and barrel are formed by counter-sinking, counter-boring, counter-forming, or some combination of the three. Each of FIGS. 3B–3F is a cross-sectional plan view. More particularly:

- FIG. 3B depicts a blind via having a bore 310a whose top end 306 is counter-formed and the barrel 320 is formed by through-plating one section of the bore 310a;
- FIG. 3C depicts a bore 310b whose top end 306 is counter-formed and whose bottom end 308 is counter-bored, while the barrel 320 is formed by through plating one section of the bore 310b;
- FIG. 3D depicts a bore 310c whose top and bottom ends 306, 308 are both counter-sunk after through-plating the bore 310c;
- FIG. 3E depicts a bore 310d whose bottom end 308 is counter-sunk after through-plating the bore 310d; and
- FIG. 3F depicts a bore 310e whose top end 306 is counter-formed and whose bottom end 308 is counter-sunk, the barrel 320 is formed by through-plating the bore 310e after the top end 306 is counter-formed but before the bottom end 308 is counter-sunk.

Generally speaking, a bore 310, or 310d–310e will be counter-sunk from the side opposite the side to which the contacts 120 are loaded. In the case of the bore 310c, this will not be possible as it is counter-sunk from both sides. Note that, in some embodiments, the barrel 320 includes at least one flange 322 extending over top and/or bottom surfaces 332, 334 around the perimeter. The flanges 322, where found, are artifacts of the manufacturing process by which this particular embodiment is fabricated and are not necessary to the practice of the invention.

One aspect of the present invention minimizes the predetermined depth $d_p$ below the trace 335 as much as is feasible in light of the manufacturing technology and available materials. It has been discovered that increasing the length of the barrel 320 in the bore 310 of a via 130 or 330 increases the capacitance imposed on the signal path by the via. The electrical contact afforded by the barrel 320 and the contact 120 should nevertheless remain sufficient to prevent signal degradation. Thus, the length of the barrel 320 will be influenced not only by the available manufacturing technology and materials, but also by the signals' characteristics. The manner in which these factors interplay and affect what constitutes a "minimally acceptable" predetermined depth $d_p$ will become apparent to those skilled in the art once they have the benefit of this disclosure. In the embodiment illustrated in FIG. 3A, current technology for counter-boring typically has a tolerance of ±4 mils, so the predetermined depth below the trace 335 is approximately 4 mils.

Another aspect of the invention minimizes the distance the first end 220 protrudes beyond the barrel 120, 320 when the interconnection is made. It has been discovered that increasing this distance increases capacitive loading on the transmitted signals, although not as much as excess barrel. Ideally, the leading tip of the first end 220 will protrude no further than the bottom edge 312 of the barrel 320 when the interconnection is made. However, in some embodiments, this ideal may not be attained at the cost of inferior performance. The reasons for failure to attain the ideal will arise from a variety of sources and will be, in part, implementation specific. Thus, the invention preferably strives to obtain some minimally acceptable protrusion beyond the bottom edge 312.

The first end 220 of the contact 120, when positioned in the bore 310, therefore does not extend substantially beyond the barrel 320. As mentioned, "minimally acceptable" will ideally be zero, but the invention is not so limited. What constitutes a "minimally acceptable" protrusion will be implementation specific, depending upon a number of factors. Exemplary of these factors are the available materials, available manufacturing technologies, the electrical characteristics of the signals to be transmitted, and assembly handling procedures. The first end 220 of the contact 120 does not "substantially protrude" in this context if it is a close to the bottom edge 312 of the barrel 320 as is practicably reasonable in light of such factors.

Two techniques by which a via 130, 330 may be fabricated in accordance with the present invention are modified from conventional practice. As mentioned above, the barrel 320 may be fabricated by electroplating the electrically conductive material so that it covers the entire interior surface of the bore 310. The bore 310 is then counter-sunk from below (or above) to remove the plated metal up to a point, e.g., the bottom edge 312, just before the trace to define what then becomes the barrel 320. Note that the counter-sinking should not affect the electrical contact between the trace 335 and the barrel 320. In some variations of this technique, the bore 310 may be counter-formed rather than counter-sunk, as was discussed above. Alternatively, the barrel 320 may be fabricated in that section of the bore 310 passing through each individual layer 305a–g as all or some of the board layers 305a–305g are fabricated but before they are laminated together. This technique is modified from the process disclosed in the 819 patent discussed above, and will be particularly useful for blind vias, although rarely used for through vias. Other techniques may also be employed.

Figure 4:
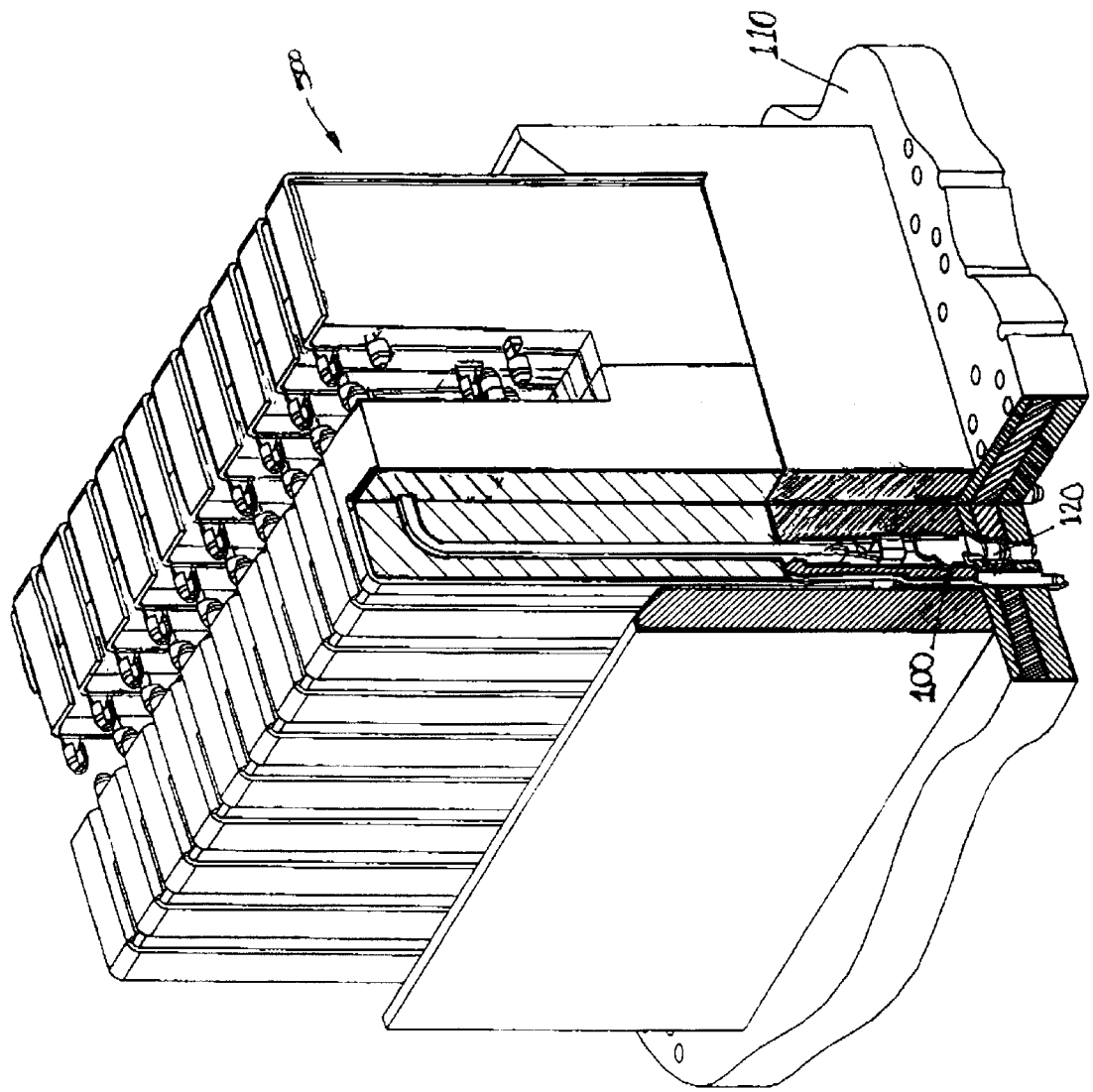

FIG. 4 depicts the interconnection 100 in the larger context 400 from which FIG. 1 is fragmented. More particularly, the contact 120 is used in conjunction with an interconnect assembly 500, best shown in FIG. 5. The interconnect assembly 500, in this particular embodiment, includes motherboard header subassembly 510 and a two-piece daughterboard pin subassembly 520. The motherboard header subassembly 510 and the daughterboard pin subassembly 520 may be any suitable subassembly known to the art.

The interconnection 100 (shown in FIGS. 1, 4) is assembled by insertingthe second end 240 of the contact 120 is then inserted into the bottom end (not shown) of the respective elevated sockets 514 (shown in FIG. 5) of the motherboard header subassembly 510. The first end 220 of the contact 120 is then inserted into the via 130 and the assembled motherboard header subassembly 510 and contact 120 are press fit against the PCB 110. The daughterboard subassembly 520 is then assembled and inserted into, in this particular embodiment, a second PCB (not shown). The mother board assembly, comprising the subassembly 510 and the PCB 110, is then mated with the daughterboard assembly, comprising the subassembly 520 and the second PCB (not shown). Note that this creates a separable interface, such as the separable interface 140 shown in FIG. 1. The fully assembled interconnection is illustrated in FIGS. 1 and 4.

Figure 6:
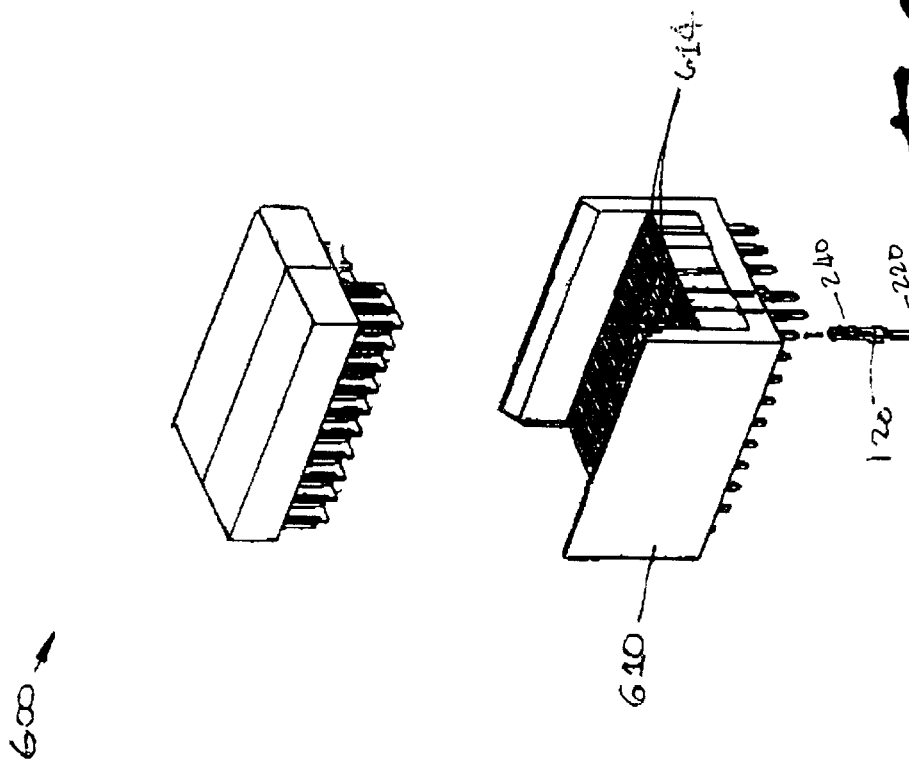
FIG. 6 shows a header assembly alternative to the one in FIG. 5 with which the contact may be used.
Figure 5:
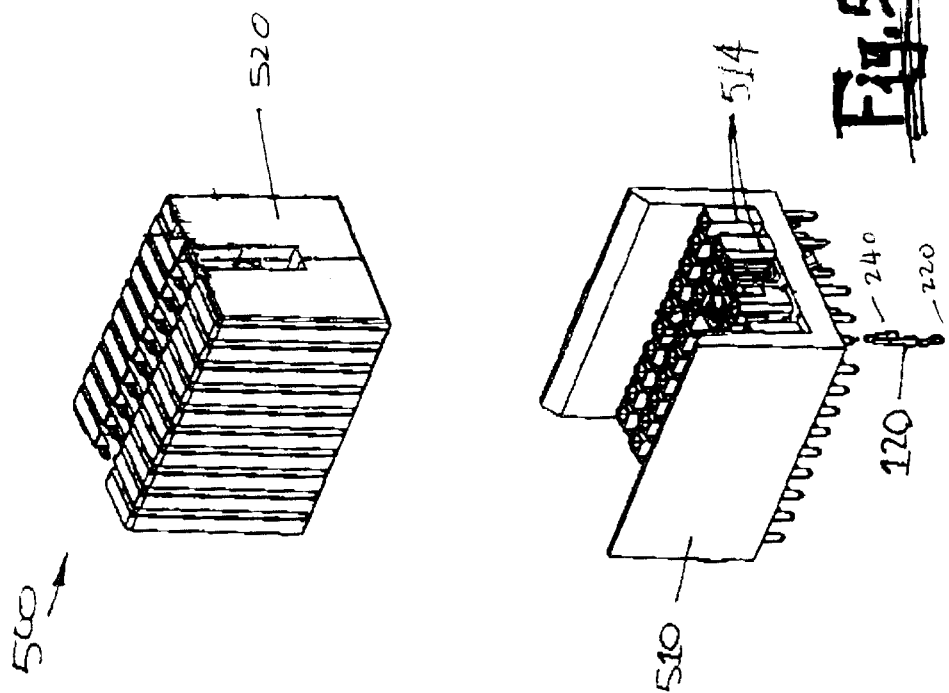
FIG. 5 illustrates the motherboard header assembly and daughterboard receptacle of the interconnection in FIG. 4 in a partially exploded view.

FIG. 6 shows an assembly 600 alternative to the assembly 500 in FIG. 5 with which the contact 120 may be used to establish a high speed interconnect in accordance with the present invention. The motherboard subassembly 610 is roughly the same as the motherboard subassembly 500, but the elevated sockets 614 are slightly different to accommodate the different designs of the pins (not shown) involved here. The two-piece daughterboard pin assembly 620 is similarly differently structured to accommodate the different pin designs. Assembling the interconnection 100 with the assembly 600 proceeds in the manner as with the assembly 500 discussed above.

FIGS. 7A–7B illustrate embodiments of the contact 120 in accordance with the present invention alternative to that shown in FIGS. 1 and 2. The contact 120b in FIG. 7A differs from the contact 120a in FIG. 2 both in the first end 220 and in the second end 240. The first end 220 comprises an eye-of-needle compliant section 210a and the second end comprises a second structure 230a including a pair of tines 702, 704. The contact 120c in FIG. 7B differs from the contact 120 in FIG. 2 in that the second structure 230b replaces the boxed pin receptacle 230. The second structure 230b is a soldering tab by which the contact 120c may be soldered to a printed circuit board or connector to effect a surface mount rather than a press fit. Thus, the second structures 230a–230b are, by way of example and illustration, a second and a third means for establishing an electrical connection alternative to the boxed pin receptacle 230 shown in FIG. 2. Other embodiments might employ still further variations on the contact 120.

Note that, although the illustrated embodiments involve the interconnection of two printed circuit boards, the invention is not so limited. For example, in FIG. 3A, a second via 340 including a barrel 320a is also shown. The barrel 320a contacts both the trace 345 and the trace 335. Insertion of the contact 120 as discussed above would then create an inter-layer interconnection between the layers 305a–305e of the printed circuit board 110. And, as mentioned above, an interconnection might include a cable and a printed circuit board in some alternative embodiments.

In one particular implementation of the illustrated embodiment, the contact 120 is constructed from phosphor bronze and the barrel 320 is constructed from copper. The barrel 320 may be fabricated by electroplating copper through the bore 310. (Excess copper on the surface 332 of the board 305 is etched away and the surface 332 cleaned.) The predetermined depth $d_p$ is approximately 1 mm since the trace 335 is located 1 mm below the top surface 332 of the board 305. The copper is electroplated to a thickness of 0.035 mm. The layers 305a–305g total approximately 4 mm thick. Thus, the total depth $d_t$, of the bore 310 is approximately 4 mm.

The particular embodiments disclosed above are therefore illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An interconnection for use in electronic equipment, the interconnection comprising:

a circuit board including a via and an electrically conductive trace, the via including a bore extending completely through the circuit board, the bore having a perimeter and a total depth through the circuit board, and an electrically conductive barrel extending around at least a portion of the perimeter of the bore and along a predetermined depth of the bore, the predetermined depth being less than the total depth of the bore, the barrel having an end that terminates at a countersunk portion of the bore in one side of the circuit board, the barrel contacting the trace; and a contact having a compliant section that is press fitted in the barrel to form an electrical signal path from the contact to the barrel, the electrical signal path being devoid of solder, wherein a separable interface exists between the contact and the circuit board, the compliant section having an end that does not extend out of the barrel toward the one side of the circuit board, wherein no part of the electrical signal path extends into the countersunk portion of the bore.

2. The interconnection of claim 1 wherein the barrel is disposed along an intermediate portion of the total depth of the bore.

3. The interconnection of claim 1 wherein the circuit board has multiple layers, and the predetermined depth corresponds to a thickness of one of the layers.

4. The interconnection of claim 1 wherein a portion of the extends out of the circuit board on a side of the circuit board opposite from the one side, and further comprising an electrical component in engagement with the contact portion.

* * * * *